United States Patent
Kulkarni et al.

(10) Patent No.: US 11,206,035 B2
(45) Date of Patent: Dec. 21, 2021

(54) ANALOG TO DIGITAL (A/D) CONVERTER WITH INTERNAL DIAGNOSTIC CIRCUIT

(71) Applicant: Texas Instruments Incorporated, Dallas, TX (US)

(72) Inventors: Rahul Vijay Kulkarni, Bangalore (IN); Shridhar More, Bangalore (IN); Amal Kumar Kundu, Bangalore (IN); Minkle Eldho Paul, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/702,090

(22) Filed: Dec. 3, 2019

(65) Prior Publication Data

US 2020/0295773 A1    Sep. 17, 2020

(30) Foreign Application Priority Data

Mar. 13, 2019 (IN) .............................. 201941009753

(51) Int. Cl.
*H03M 1/10* (2006.01)
*H03M 1/12* (2006.01)
*H03M 1/46* (2006.01)

(52) U.S. Cl.
CPC ....... *H03M 1/1071* (2013.01); *H03M 1/1076* (2013.01); *H03M 1/122* (2013.01); *H03M 1/468* (2013.01)

(58) Field of Classification Search
None
See application file for complete search history.

(56) References Cited

U.S. PATENT DOCUMENTS

| 4,679,028 A * | 7/1987 | Wilson ................ H03M 1/1071 341/120 |
| 4,982,194 A * | 1/1991 | Bacrania ............. H03M 1/0836 341/161 |
| 6,268,813 B1 * | 7/2001 | de Wit .................. H03M 1/108 341/120 |

(Continued)

FOREIGN PATENT DOCUMENTS

JP    2017069854    4/2017

OTHER PUBLICATIONS

International Search Report in corresponding PCT Application No. PCT/US2020/021344, dated Jun. 11, 2020 (2 pages).

*Primary Examiner* — Khai M Nguyen
(74) *Attorney, Agent, or Firm* — Ray A. King; Charles A. Brill; Frank D. Cimino

(57) ABSTRACT

An analog to digital (A/D) converter includes a capacitor array having respective first terminals selectively coupled to a reference voltage or ground via a plurality of switches and having respective second terminals coupled to a sample and hold (S/H) output. The A/D converter also includes a voltage comparator having a first input coupled to the S/H output and having a second input coupled to a bias voltage. The voltage comparator is configured to output a comparison voltage responsive to a sampled charge at the S/H output and the bias voltage. The A/D converter also includes a successive approximation register coupled to receive the comparison voltage and configured to output an approximate digital code responsive to the comparison voltage, wherein the approximate digital code is varied by controlling an equivalent capacitance of the capacitor array.

24 Claims, 2 Drawing Sheets

(56) References Cited

U.S. PATENT DOCUMENTS

| | | | |
|---|---|---|---|
| 7,158,070 B1 | 1/2007 | Yang | |
| 8,633,844 B2* | 1/2014 | Piasecki | H03M 1/468 |
| | | | 341/155 |
| 8,754,798 B2* | 6/2014 | Lin | H03M 1/10 |
| | | | 341/155 |
| 9,853,655 B1* | 12/2017 | Pernull | H03M 1/1071 |
| 9,893,739 B2* | 2/2018 | Bode | H03M 1/1023 |
| 9,960,777 B2 | 5/2018 | Duryea et al. | |
| 10,079,609 B2 | 9/2018 | Fan | |
| 2013/0249723 A1* | 9/2013 | Dey | H03M 1/109 |
| | | | 341/120 |
| 2018/0191365 A1 | 7/2018 | Zanikopoulos et al. | |

* cited by examiner

ANALOG TO DIGITAL (A/D) CONVERTER WITH INTERNAL DIAGNOSTIC CIRCUIT

CROSS REFERENCE TO RELATED APPLICATIONS

This application claims priority from Indian provisional application No. 201941009753, filed Mar. 13, 2019, entitled "SAR ADC WITH BUILT-IN DIAGNOSTIC FOR TESTING 'SAFETY BITS' IN SAFETY CRITICAL APPLICATIONS", assigned to the present assignee and incorporated herein by reference.

BACKGROUND

The disclosure generally relates to an analog to digital (A/D) converter with an internal diagnostic circuit.

DESCRIPTION OF THE RELATED ART

In safety/critical applications, analog input (AI) modules are used to measure parameters such as temperature, pressure, voltage level, air quality, etc. The AI modules output control signals responsive to input parameters, and the control signals are converted to digital code by analog to digital (A/D) converters. Since detecting faults in the AI modules is desired in safety/critical applications, it is essential to ensure that output bits of an A/D converter toggle independent of adjacent bits. If one or more output bits of an A/D converter fail to toggle independent of adjacent bits, the A/D converter is not suitable for use.

FIG. 1 illustrates an external test circuit 100 used to test an A/D converter 104. During a normal operating mode, analog signal generated by an AI module 108 is multiplexed by a 2:1 multiplexer 112 to the A/D converter 104 which generates a digital code representative of the analog signal. During a test mode, a digital to analog (D/A) converter 116 generates a test signal responsive to a digital code. Noise generated by a generator 120 can be added to the test signal at a summer 124. The test signal with the added noise is multiplexed by the multiplexer 112 to the A/D converter 104. The test signal is varied by changing the digital code, and the output of the A/D converter 104 is examined to ensure all output bits of the A/D converter 104 toggle independent of adjacent bits.

The external test circuit 100 has several drawbacks. The external test circuit 100 requires PCB area and adds a failure mode in safety/critical systems. Also, since AI modules for safety/critical applications are typically designed with isolated input channels for increased reliability, multiple instances of the external test circuit are required for the isolated input channels.

SUMMARY

Various aspects of the present disclosure are directed to an analog to digital (A/D) converter with an internal diagnostic circuit. In one aspect, the A/D converter includes a capacitor array having respective first terminals selectively coupled to a reference voltage or ground via a plurality of first switches and having respective second terminals coupled to a sample and hold (S/H) output, wherein the S/H output is selectively coupled to a bias voltage via a second switch. The A/D converter further includes a voltage comparator having a first input coupled to the S/H output and having a second input coupled to the bias voltage. The voltage comparator is configured to output a comparison voltage responsive to a sampled charge at the S/H output and the bias voltage. The A/D converter also includes a successive approximation register coupled to receive the comparison voltage and configured to output an approximate digital code responsive to the comparison voltage. The approximate digital code is varied by controlling an equivalent capacitance of the capacitor array.

In an additional aspect of the disclosure, the capacitor array comprises a plurality of switched binary-weighted capacitors. The sampled charge at the S/H output is controlled by varying the number of switched binary-weighted capacitors.

In an additional aspect of the disclosure, the equivalent capacitance is increased by increasing the number of switched binary-weighted capacitors interconnected in parallel, and the equivalent capacitance of the capacitor array is decreased by reducing the number of switched binary-weighted capacitors interconnected in parallel.

In an additional aspect of the disclosure, the S/H output is coupled to the bias voltage via the second switch during a sample phase and is de-coupled from the bias voltage during a hold phase.

In an additional aspect of the disclosure, during the sample phase both the first and second inputs of the voltage comparator are coupled to the bias voltage, and during the hold phase the second input of the voltage comparator is coupled to the bias voltage and the first input of the voltage comparator is not coupled to the bias voltage.

In an additional aspect of the disclosure, during the hold phase the first input of the voltage comparator is coupled to the S/H output and the second input of the voltage comparator is coupled to the bias voltage.

In an additional aspect of the disclosure, a fault bit is diagnosed if at least one bit of the approximate digital code fails to toggle when the ratio is varied.

In an additional aspect of the disclosure, an A/D converter with an internal diagnostic circuit includes a capacitor array having respective first terminals selectively coupled to a reference voltage or ground via a plurality of first switches and having respective second terminals coupled to a sample and hold (S/H) output, wherein the S/H output is selectively coupled to a bias voltage via a second switch during a sample phase and is de-coupled from the bias voltage via the second switch during a hold phase. The A/D converter also includes a voltage comparator having a first input coupled to the S/H output and having a second input coupled to the bias voltage. The voltage comparator is configured to output a comparison voltage responsive to a sampled charge at the S/H output and the bias voltage. The A/D converter also includes a successive approximation register coupled to receive the comparison voltage and configured to output an approximate digital code responsive to the comparison voltage. During the sample phase both the first and second inputs of the voltage comparator are coupled to the bias voltage, and during the hold phase the second input of the voltage comparator is coupled to the bias voltage and the first input of the voltage comparator is not coupled to the bias voltage.

In an additional aspect of the disclosure, an A/D converter with an internal diagnostic circuit includes a capacitor array including a plurality of switched binary-weighted capacitors having respective first terminals selectively coupled to a reference voltage or ground via a plurality of first switches and having respective second terminals coupled to a sample and hold (S/H) output, wherein the S/H output is selectively coupled to a bias voltage via a second switch. The A/D converter also includes a voltage comparator having a first input coupled to the S/H output and having a second input coupled to the bias voltage. The voltage comparator is configured to output a comparison voltage responsive to a sampled charge at the S/H output and the bias voltage. The A/D converter also includes a successive approximation register coupled to receive the comparison voltage and configured to output an approximate digital code responsive to the comparison voltage. During a sample phase the second switch couples the S/H output to the bias voltage and during a hold phase the second switch decouples the S/H output from the bias voltage, and during the sample phase both the first and second inputs of the voltage comparator are coupled to the bias voltage, and during the hold phase the second input of the voltage comparator is coupled to the bias voltage and the first input of the voltage comparator is not coupled to the bias voltage.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

Figure 2:
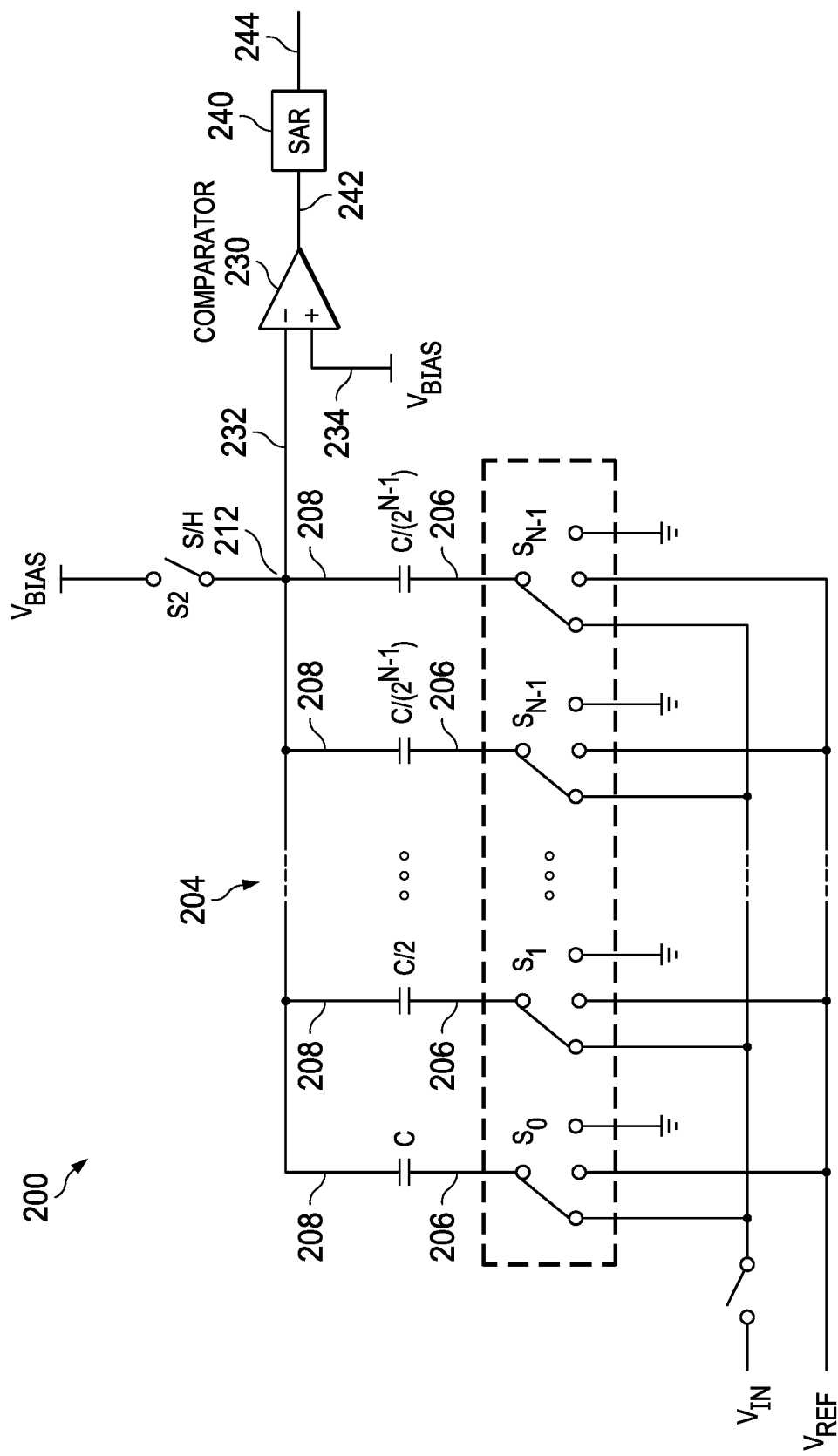
FIG. 2 is an A/D converter in accordance with an exemplary embodiment.

FIG. 2 is a schematic of an analog to digital (A/D) converter 200 in accordance with an exemplary embodiment. The A/D converter 200 includes an internal diagnostic circuit 204 which provides a controlled voltage source that is used to test output bits of the A/D converter 200, thus eliminating a need for an external test circuit. The A/D converter 200 can be implemented in an integrated circuit (IC) and can be used in safety/critical applications where high availability is desired.

With reference to FIG. 2, the A/D converter 200 includes a capacitor array 204 which includes a plurality of capacitors having respective first terminals 206 and second terminals 208. In an exemplary embodiment, the capacitor array 204 is formed with a plurality of switched binary-weighted capacitors (e.g., C, C/2. C/4, . . . ). The A/D converter 200 also includes first switches S0-SN–1 configured to selectively couple the first terminals 206 of the capacitor array 204 to a reference voltage Vref or ground. The second terminals 208 of the capacitor array 204 are coupled to a sample and hold (S/H) output 212. The A/D converter 206 also includes a second switch S2 configured to selectively couple the S/H output 212 to a bias voltage Vbias. During other modes of operation of the A/D converter 200, the first terminals 206 of the capacitor array 204 are connected to an input voltage Vin.

With continuing reference to FIG. 2, the A/D converter 200 also includes a voltage comparator 230 having a first input 232 coupled to the S/H output 212 and a second input 234 coupled to the bias voltage Vbias. The voltage comparator 230 is configured to output a comparison voltage responsive to a sampled charge at the S/H output 212 and the bias voltage Vbias.

In an exemplary embodiment, the sampled charge at the S/H output 212 can be varied by the number of switched binary-weighted capacitors coupled to the reference voltage Vref. Some or all of the binary weighted capacitors' first terminals 206 can be connected to the reference voltage Vref, and some or all of the binary weighted capacitors' first terminals 206 can be connected to ground.

With continuing reference to FIG. 2, the A/D converter 200 also includes a successive approximation register (SAR) 240 having an input 242 coupled to receive the comparison voltage. The SAR 240 is configured to generate an approximate digital code responsive to the comparison voltage at an output 244. The approximate digital code is a digital representation of the S/H voltage at the S/H output 212. The approximate digital code is varied by controlling an equivalent capacitance of the capacitor array 204. In an exemplary embodiment, the SAR 240 applies a binary search algorithm to output the approximate digital code With continuing reference to FIG. 2, the equivalent capacitance of the capacitor array 204 can be controlled by varying the number of binary-weighted capacitors interconnected in parallel. By increasing the number of binary-weighted capacitors interconnected in parallel, the equivalent capacitance of the capacitor array 204 is increased, and by reducing the number of binary-weighted capacitors interconnected in parallel, the equivalent capacitance of the capacitor array 204 is decreased.

With continuing reference to FIG. 2, during a sample phase, the first terminals 206 of the capacitor array 204 are selectively connected by closing the first switches, S0-SN–1, to either the reference voltage Vref or ground. Also, during the sample phase, the second switch S2 is closed to couple the S/H output 212 to the bias voltage Vbias. Thus, during the sample phase both the first and second inputs 232, 234 of the voltage comparator 230 are coupled to the bias voltage Vbias. The capacitor array 204 is charged by the reference voltage Vref and has a charge equal to the capacitance multiplied by the reference voltage Vref. The sampled charge created is equal to (Vref)×(ΣCn), where Cn are switched-binary-weighted capacitors connected to Vref.

Next, during a hold (or conversion) phase, the second switch S2 is opened to de-couple the S/H output 212 from the bias voltage Vbias. As a consequence, during the hold (conversion phase), although the first input 232 of the voltage comparator 230 is de-coupled from the bias voltage Vbias, the first input 232 of the voltage comparator 230 remains coupled to the S/H output 212 and the second input 234 of the voltage comparator 230 remains coupled to the bias voltage Vbias. The voltage comparator 230 outputs the comparison voltage responsive to the sampled charge at the S/H output 212 and the bias voltage Vbias. The comparison voltage is applied to the input 242 of the SAR 240. The SAR 240 applies a binary search algorithm to the comparison voltage and outputs the approximate digital code which is a digital representation of the S/H voltage. The SAR 240 can be realized in hardware or software.

Figure 1:
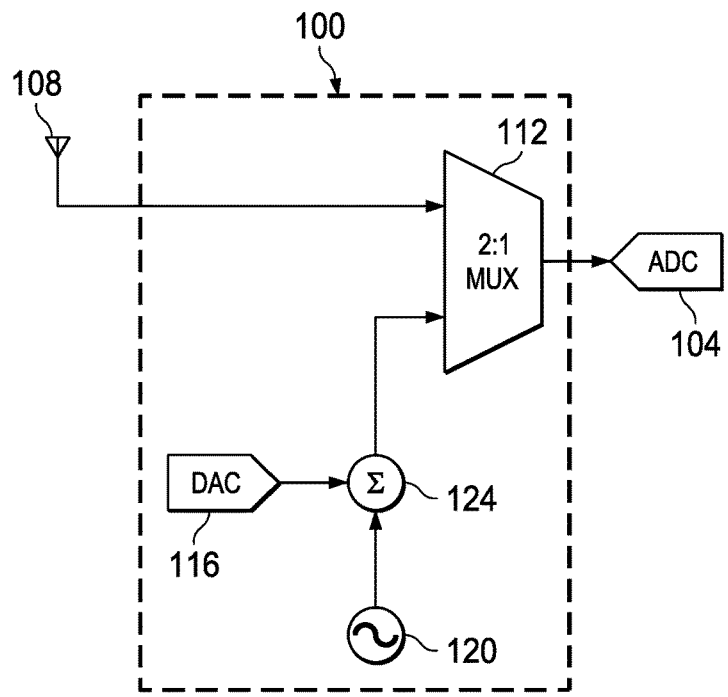
FIG. 1 shows an external test circuit used to test an A/D converter.
Figure 3:
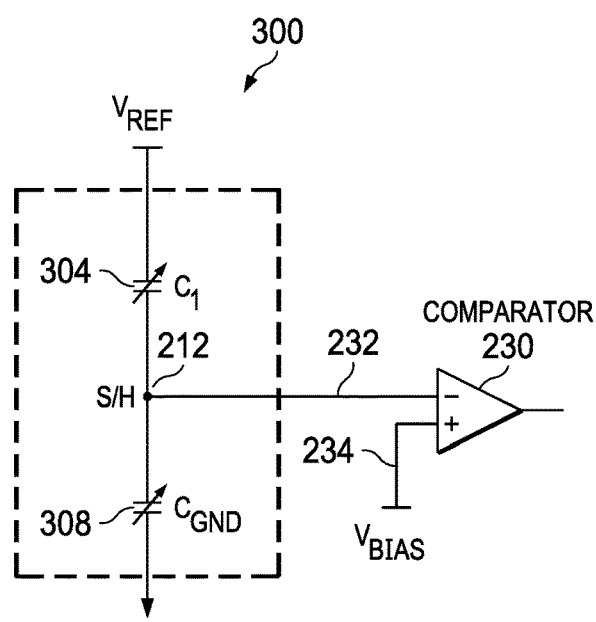
FIG. 3 illustrates an equivalent circuit.

FIG. 3 illustrates a simplified equivalent circuit 300 during the hold (or conversion) phase. The first input 232 of the voltage comparator 230 is de-coupled from the bias voltage Vbias. However, the first input 232 of the voltage comparator 230 remains coupled to the S/H output 212 and the second input 234 remains coupled to the bias voltage Vbias. A capacitor array 304 comprising a plurality of switched binary-weighted capacitors are coupled to the reference voltage Vref. The sampled charge at the S/H output 212 is controlled by varying the number of switched binary-weighted capacitors in the capacitor array. A selected number of capacitors 308 are coupled to ground. Although the reference voltage Vref, which is internally available inside the integrated circuit, has a constant voltage level, the sampled charge at the S/H output 212 is scaled by varying the equivalent capacitance of the capacitor array.

Figure 4:
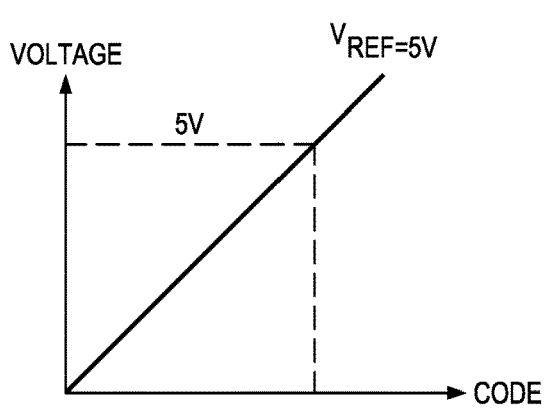
FIG. 4 is a plot of a voltage sampled by a comparator.

FIG. 4 illustrates the voltage sampled by the comparator 230. By using a user specified code, the sampled charge at the S/H output 212 is varied to a maximum value of (Vref)×(ΣCn). The sampled charge at the S/H output 212 is varied to test the approximate digital code produced by the SAR 240. As the sampled charge at the S/H output 212 is varied using the user specified code, if at least one of the bits of the approximate digital code fails to toggle independent of adjacent bits, a determination is made that the A/D converter 200 has at least one fault bit, which may render the A/D converter 200 unsuitable for safety/critical applications where high availability is desired.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. An analog to digital (A/D) converter comprising:
   a sample switch having first and second sample switch terminals, the first sample switch terminal coupled to a bias voltage terminal, the second sample switch terminal coupled to a sample and hold (S/H) output;
   an array of switches, each array switch having first and second array switch terminals, each first array switch terminal selectively coupled to one of an input voltage, a reference voltage, or ground;
   an array of capacitors, each capacitor having first and second capacitor terminals, each first capacitor terminal coupled to a respective second array switch terminal, and each second capacitor terminal coupled to the S/H output;
   a voltage comparator having first and second comparator inputs and a comparator output, the first comparator input coupled to the S/H output, and the second comparator input coupled to the bias voltage terminal; and
   a successive approximation register (SAR) having a SAR input and a SAR output, the SAR input coupled to the comparator output, and the SAR output configured to provide a digital code;
   in an internal diagnostic mode, the digital code provided by the SAR is varied by a known amount, resulting in a variation in a capacitance of the capacitor array.

2. The A/D converter of claim 1, wherein the capacitor array includes switched binary-weighted capacitors.

3. The A/D converter of claim 2, wherein the S/H output is controlled by varying a number of switched binary-weighted capacitors connected to the reference voltage.

4. The A/D converter of claim 3, wherein the capacitance is increased by increasing a number of switched binary-weighted capacitors connected in parallel, and wherein the capacitance of the capacitor array is decreased by reducing the number of switched binary-weighted capacitors connected in parallel.

5. The A/D converter of claim 1, wherein the digital code is a digital representation of the voltage at the S/H output.

6. The A/D converter of claim 1, wherein the S/H output is coupled to the bias voltage terminal via the sample switch during a sample phase and is de-coupled from the bias voltage terminal during a hold phase.

7. The A/D converter of claim 6, wherein during the sample phase, both the first and second comparator inputs are coupled to the bias voltage terminal, and during the hold phase, the second comparator input is coupled to the bias voltage terminal and the first comparator input is not coupled to the bias voltage terminal.

8. The A/D converter of claim 7, wherein during the hold phase, the first comparator input is coupled to the S/H output, and the second comparator input is coupled to the bias voltage terminal.

9. The A/D converter of claim 1, wherein a fault bit is diagnosed if at least one bit of an approximate digital code fails to toggle in response to varying the digital code.

10. The A/D converter of claim 1, wherein the reference voltage is provided by an integrated circuit.

11. An analog to digital (A/D) converter with an internal diagnostic circuit comprising:
    a sample switch having first and second sample switch terminals, the first sample switch terminal coupled to a bias voltage terminal, the second sample switch terminal coupled to a sample and hold (S/H) output, the S/H output being selectively coupled to a bias voltage terminal during a sample phase and de-coupled from the bias voltage terminal during a hold phase;
    an array of switches, each array switch having first and second array switch terminals, each first array switch terminal selectively coupled to one of an input voltage, a reference voltage, or ground;
    an array of capacitors having first and second capacitor terminals, each first capacitor terminal coupled to a respective second array switch terminal, and each second capacitor terminal coupled to the S/H output;
    a voltage comparator having first and second comparator inputs and a comparator output, the first comparator input coupled to the S/H output, and the second comparator input coupled to the bias voltage terminal; and
    a successive approximation register (SAR) having a SAR input and a SAR output, the SAR input coupled to the comparator output, and the SAR output configured to provide a digital code;
    during the sample phase, the first comparator input is coupled to the bias voltage terminal, and during the hold phase, the second input of the voltage comparator is coupled to the bias voltage terminal and the the first comparator input is decoupled from the bias voltage terminal; and
    in an internal diagnostic mode, the digital code provided by the SAR is varied by a known amount, resulting in a variation in a capacitance of the capacitor array.

12. The A/D converter of claim 11, wherein the capacitor array includes switched binary-weighted capacitors.

13. The A/D converter of claim 12, wherein the S/H output is controlled by varying the number of switched binary-weighted capacitors connected to the reference voltage.

14. The A/D converter of claim 12, wherein a capacitance of the capacitor array is controlled by varying the number of switched binary-weighted capacitors connected in parallel.

15. The A/D converter of claim 14, wherein the capacitance of the capacitor array is increased by increasing the number of switched binary-weighted capacitors connected in parallel, and wherein the capacitance of the capacitor array is decreased by reducing the number of switched binary-weighted capacitors connected in parallel.

16. The A/D converter of claim 11, wherein the digital code is a digital representation of the voltage at the S/H output.

17. The A/D converter of claim 11, wherein a fault bit is diagnosed if at least one bit of an approximate digital code fails to toggle in response to varying the digital code.

18. The A/D converter of claim 11, wherein the reference voltage is provided by an integrated circuit.

19. An analog to digital (A/D) converter with an internal diagnostic circuit comprising:
  a sample switch having first and second sample switch terminals, the first sample switch terminal coupled to a bias voltage terminal, and the second sample switch terminal coupled to a sample and hold (S/H) output;
  an array of switches, each array switch having first and second array switch terminals, each first array switch terminal selectively coupled to one of an input voltage, a reference voltage, or ground;
  an array of capacitors including switched binary-weighted capacitors, each capacitor having first and second capacitor terminals, each first capacitor terminal coupled to a respective second array switch terminal, and each second capacitor terminal coupled to the sample and hold (S/H) output;
  a voltage comparator having first and second comparator inputs and a comparator output, the first comparator input coupled to the S/H output, and the second comparator input coupled to the bias voltage terminal; and
  a successive approximation register (SAR) having a SAR input and a SAR output, the SAR input coupled to the comparator output, and the SAR output configured to provide a digital code;
  during a sample phase, the sample switch couples the S/H output to the bias voltage terminal, and during a hold phase, the sample switch decouples the S/H output from the bias voltage terminal; and
  in an internal diagnostic mode, the digital code provided by the SAR is varied by a known amount, resulting in a variation in a capacitance of the capacitor array.

20. The A/D converter of claim 19, wherein the capacitance of the capacitor array is controlled by varying the number of switched binary-weighted capacitors connected in parallel.

21. The A/D converter of claim 20, wherein the capacitance of the capacitor array is increased by increasing the number of switched binary-weighted capacitors connected in parallel, and the capacitance of the capacitor array is decreased by reducing the number of switched binary-weighted capacitors connected in parallel.

22. The A/D converter of claim 19, wherein the digital code is a digital representation of the voltage at the S/H output.

23. The A/D converter of claim 19, wherein a fault bit is diagnosed if at least one bit of the digital code fails to toggle in response to varying the digital code.

24. The A/D converter of claim 19, wherein the SAR applies a binary search algorithm to provide the digital code.

* * * * *